United States Patent [19]

Wright

[11] Patent Number: 4,910,839
[45] Date of Patent: Mar. 27, 1990

[54] METHOD OF MAKING A SINGLE PHASE UNIDIRECTIONAL SURFACE ACOUSTIC WAVE TRANSDUCER

[75] Inventor: Peter Wright, Dallas, Tex.

[73] Assignee: R.F. Monolithics, Inc., Dallas, Tex.

[21] Appl. No.: 677,513

[22] Filed: Dec. 3, 1984

[51] Int. Cl.⁴ .............................. H01L 41/22
[52] U.S. Cl. .................. 29/25.35; 310/313 B
[58] Field of Search ........... 29/25.35; 310/313 B, 310/313 C, 313 D

[56] References Cited

U.S. PATENT DOCUMENTS 4,353,046  10/1982  Hartmann ............... 310/313 D

Primary Examiner—Carl E. Hall
Attorney, Agent, or Firm—Michael A. O'Neil

[57] ABSTRACT

A single-phase unidirectional surface acoustic wave transducer comprising a piezoelectric substrate and a transducer having localized symmetry and constructed for establishing a predetermined separation between the centers of acoustic wave reflection and transduction on said substrate by selectively orienting the transducer on a specific cut of said substrate to achieve a separation between said centers in a continuum of achievable phase angles of 0°–360°.

14 Claims, 3 Drawing Sheets

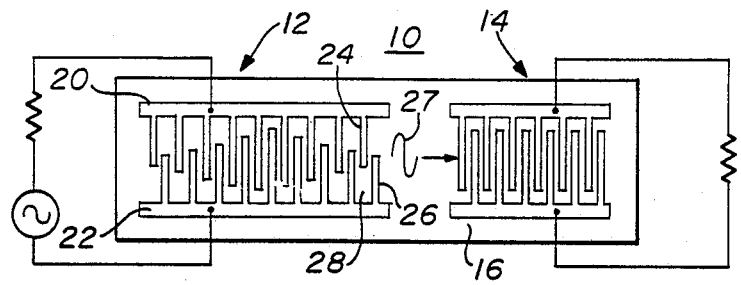
FIG. 1
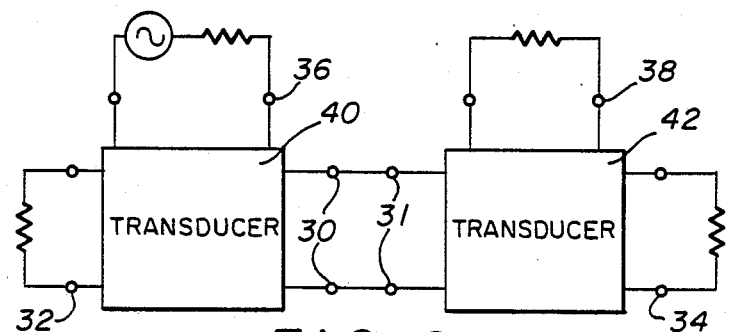
FIG. 2
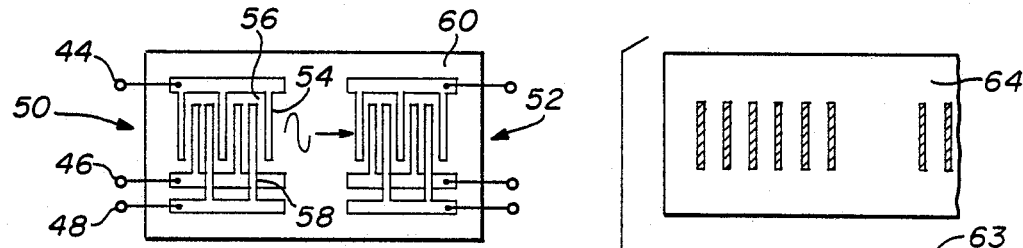
FIG. 3
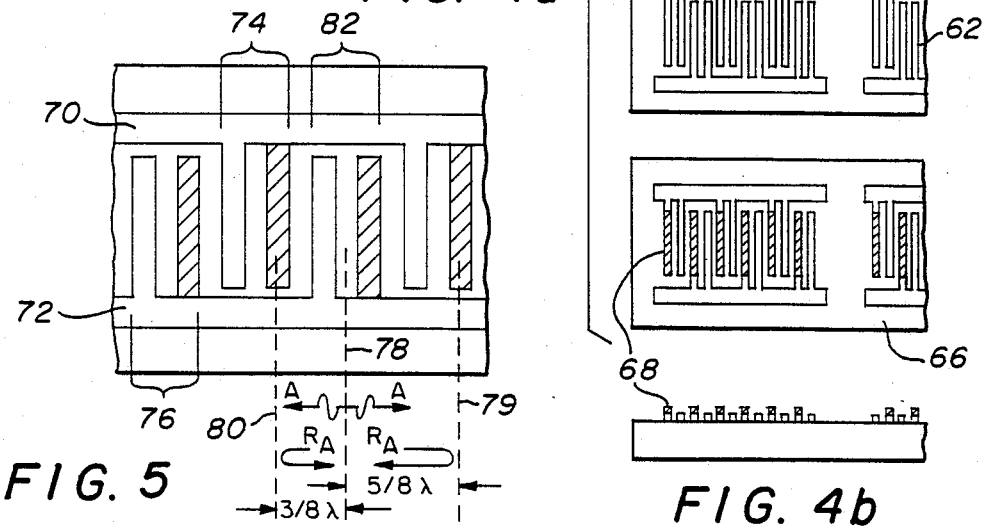
FIG. 4a
FIG. 5
FIG. 4b

INPUT ADMITTANCE

METHOD OF MAKING A SINGLE PHASE UNIDIRECTIONAL SURFACE ACOUSTIC WAVE TRANSDUCER

BACKGROUND OF THE INVENTION

The present invention relates to a surface acoustic wave transducer and, in general, to a surface acoustic wave device in which the phase angle separation between the centers of electric wave transduction and the centers of acoustic wave reflection may be adjusted by varying the locations of the centers of wave transduction.

In particular, the phenomenon of controlling the centers of the electric wave transduction with respect to the centers of acoustic wave reflection allows the achievement of a single-phase unidirectional transducer structure having one-quarter wave length fingers and gaps, a feat which is not possible by the use of such fingers and gaps in the prior art.

As used herein, the term "unidirectional" implies a device in which the two transduced counter propagating acoustic waves are of substantially unequal amplitudes. The degree of unidirectionality or directivity of the device is the ratio of the power in the desired direction to that in the undesired direction.

The radio frequency spectrum is a finite national resource which must be efficiently managed in an attempt to satisfy the ever increasing demands upon it. Ways must be found to increase the number of users, or services, that can be allocated to a given frequency band. Currently the greatest pressure on the RF spectrum is in the frequency range 50 MHz to 1 GHz. A significant portion of this spectrum is presently wasted because of the inferior selectivity of most current receivers. "Guard bands" must be left unallocated between channels in order to avoid adjacent channel interference. A high-selectivity mass-production low-cost filter technology is urgently needed to improve this situation. Surface Acoustic Wave (SAW) filters appear to be the most promising candidates for fulfilling this role.

SAW devices are compact, lightweight, robust, and, because they are a planar technology, cheap to manufacture. They can be mass produced using the same techniques developed so successfully for the production of silicon integrated circuits. A wide variety of analogue signal processing functions can be achieved with SAW devices. Among other applications, they are currently used in pulse compression radar systems, as receiver bandpass filters, or as resonators for stabilizing oscillators in numerous applications. They have replaced many of the coils, capacitors, and metal cavities of conventional radio frequency systems, removing the need for hand alignment and dramatically improving the reliability and performance. They have simultaneously resulted in significant reductions in both size and cost.

The sharp-cutoff bandpass filtering characteristics achievable with SAW filters in the VHF and UHF ranges could significantly reduce the problems of adjacent channel interference, thereby permitting much closer allocation of frequency channels. However, this has not happened to any great extent mainly because of one major drawback to SAW filters. In general, SAW filters have very high insertion losses, typically in excess of 20 dB. For receiver front-end filter applications, therefore, a SAW filter must be preceded by a high-gain low-noise amplifier to ensure an adequate system noise figure. However, attempts to compensate for such a large filter insertion loss are hampered by dynamic range problems associated with the low-noise amplifier.

The high insertion loss of a SAW filter is not inherent in the technology; material limits and propagation losses are not the problem. Rather it is a result of the topology whereby a SAW filter is implemented. Low-loss SAW filters of more complex design have been developed. However, they tend to operate only over restricted frequency ranges, have poor out-of-band response, or require large and complex matching networks. The subject of this invention allows the use of a SAW device in many applications such as a novel Single-Phase Unidirectional Transducer (SPUDT) which overcomes many of the restrictions set forth above on low-loss SAW filter performance. For instance, a low-loss SPUDT will allow highly-selective SAW bandpass filters to become the standard for all front-end receiver applications.

In the prior art, SAW transducers tend to reflect acoustic signals incident on them. These reflections cause signals to bounce back and forth between the input and output transducers of a SAW device. In many system applications, these multiple reflections can result in a smaller replica of the original signal emerging from the filter several microseconds after the desired signal. This phenomenon is often referred to as "triple transit" echo since the strongest of the replica signals is the one which "transits" the device three times. In systems such as television receivers, this effect can seriously degrade the performance of the receiver.

The reflections from the acoustic port of conventional SAW transducers have two components. The first is the discontinuity reflection which is the reflection due to the mechanical and electrical discontinuities presented by the electrodes themselves on the surface under short circuit conditions. The second is electrical regeneration which results from re-radiation of the incident wave by the transducer due to the electrical output voltage on the transducer electrodes. In the prior art the discontinuity reflections have generally been eliminated by means of transducer structures using three or four electrodes per wave length whereby the reflections from one electrode are cancelled by the reflections from neighboring electrodes. The only method in a conventional transducer structure to suppress the regeneration reflections is to deliberately mismatch the filter to reduce the level of the electric voltage on the transducer but the result is a high filter insertion loss. The electrical mismatch loss that results is typically 20 to 25 dB before acceptable echo suppression is achieved. Multi-phase and single-phase unidirectional SAW filters have been used to overcome this insertion loss/triple transit tradeoff.

A three-phase transducer employs three or four electrodes per wave length and achieves its unidirectional characteristics by means of a multi-phase electrical drive. The required three phases are achieved using a complex matching network on the electrical port. The matching network, consisting of lumped element coils and capacitors, adds cost to the filter but more importantly can be bulky and difficult to tune. The necessity for such a matching network removes much of the motivation for using a SAW device in many circuits. The principal attractions of SAW devices are that they are small, require no tuning and eliminate the need for unreliable lumped-element components. Conventional high-loss SAW filter designs are thus frequently preferred over three-phase designs, in many applications, despite their much higher insertion loss. A futher disadvantage is that three-phase transducers also require a multi-level fabrication process, with air-gap crossovers, which makes them difficult and expensive to fabricate.

When driven by the proper multi-phase matching networks as set forth in U.S. Pat. No. 3,686,518, launching or receiving the surface wave from only one end of the transducer is achieved. The reverse acoustic port is thus effectively eliminated and this structure with its matching network, becomes an effective two-port device which can be matched at both ports thereby achieving low insertion loss and low triple transit reflections simultaneously. This structure has the disadvantage, however, that it requires complex three-phase matching networks for proper operation. In addition it is difficult and expensive to fabricate. The finger and gap widths in a three electrode per wave length structure are one-sixth of the operating acoustic wave length which further limits the frequency range of the device due to photolithographic constraints.

The minimum practical geometry is typically around 0.7 micron. With one-quarter wave length electrodes, this limits the maximum design frequency of a SAW transducer to around 1.2 GHz. A multiphase transducer with one-sixth wave length electrodes has a corresponding frequency limitation of around 800 MHz. In addition, at this frequency the multi-level structure and air gap crossovers become extremely difficult to fabricate.

It will be noted from a review of the prior art, Smith et al, "Analysis of Interdigital Surface Wave Transducers by use of an Equivalent Circuit Model", *IEEE Trans. on Microwave Theory and Techniques*, Vol. MTT-17, No. 11, Nov. 1969. pp 856–864, that the centers of transduction in a SAW device are typically considered to be either at the centers of the gaps or the centers of the fingers.

In this invention it will be necessary to consider the spatial separation of the centers of transduction and the centers of reflection within a transducer (both quantities are defined below). Defining these quantities is a complex task because the displacement associated with a surface acoustic wave is a complex motion with up to three components of mechanical displacement plus an electric potential, each of which has differing magnitude and phase that vary quasi-independently as a function of distance away from the substrate surface. The relative magnitude and phases of these components change as a function of the propagation direction, crystal orientation and the overlay, e.g. metalization, on the surface of the crystal substrate. It is an object of this invention to choose substrate orientations and transducer metalizations which will demonstrate desirable properties regarding transduction and reflection.

Any one of the displacement components or the potential or some linear combination of them can be chosen as the reference amplitude and phase for the surface wave. The exact choice will affect the locations of the centers of transduction and the centers of reflection but the spatial separation of these quantities will be unchanged by the choice of reference displacement. One can show from reciprocity that independent of the choice of reference variable, for any lossless discontinuity on the crystal surface the reflection coefficient for forward traveling waves will equal the negative complex conjugate of the reflection coefficient for backward traveling waves. This is represented by the equation $\Gamma_- = -\Gamma_+^*$.

If the crystal of interest has a plane of reflection symmetry perpendicular to the desired propagation direction and if one chooses a single physical variable as the reference variable, and if a reflective element has a symmetric center (for example a single transducer electrode) then if the reference plane for the reflection is chosen at the symmetric center of the element (at the center of the electrode for example) then it must also follow that the reflection coefficient for forward waves must equal the reflection coefficient for backward waves at the symmetric point. Thus, $\Gamma_- = \Gamma_+$.

These two equations can only be satisfied simultaneously if the reflection coefficient is pure imaginary at the center of the reflective element (the center of the electrode in the example). It should be understood that reflections can originate from all parts of the element but in this case they are modeled as arising from a single point reflection. It should also be understood that if the reference wave amplitude and phase are selected to be a linear combination of the physical variables which do not have a symmetric relation to the surface or the element, then the reflection coefficient is not normally pure imaginary at the center of the reflective element.

In the present invention, propagation directions on crystal orientations are utilized which do not have a plane of reflection symmetry perpendicular to the propagation direction. Thus the reflection coefficient at the symmetric center of a reflective element (an electrode in this case) need not be pure imaginary. However, the reciprocity requirement ($\Gamma_- = -\Gamma_+^*$) must still be satisfied.

In most cases where the detailed calculation of the displacement associated with SAW propagation is discussed in the literature, the component of material displacement which is parallel to the propagation direction is used as the reference wave component. For consistency, we will assume this same reference component. The centers of reflection for a reflective element, as defined herein, are considered to be the points where the reflection coefficient is purely imaginary. The reflection coefficient can be either positive or negative. The centers of transduction, as defined herein, are considered to be the points in a transducer where the locally transduced components of the forward and backward waves are in phase with each other.

If these definitions are applied to a two electrode per wave length transducer, the result would have four centers of reflection per wave length and two centers of transduction per wave length. Adjacent centers of reflection would have opposite sign and have a spacing of one-quarter wave length.

If a two electrode per wave length transducer is placed on a crystal substrate which has a plane of reflection symmetry perpendicular to the propagation direction, then the centers of transduction will coincide with two of the centers of reflection. Further, if one of the displacement components is used as the reference wave amplitude and phase, there will always be a center of reflection centered on each electrode and the center of transduction will always be either centered under the electrodes or centered in the gaps. In the prior art, most SAW substrate materials which were used for practical devices had a plane of reflection symmetry perpendicular to the propagation direction. Even in cases where this is not true (Y cut, Z propagation, lithium niobate, for example), the shift between the reflection and transduction centers is sufficiently small such that the published models of transducers with internal reflections that assume such reflection symmetry give acceptable agreement with experimental results.

Reflections from electrodes have been discussed in the literature previously. See for example, W. H. Haydl et al, "Design of Quartz and Lithium Niobate SAW Resonators Using Aluminum Metalization", *Proceedings of the 30th Annual Frequency Control Symposium*, June 1976, pages 346-357. In this paper, it is assumed that all reflections are pure real when referenced to the edge of a electrode. However, as pointed out by R.C.M. Li and J. Melngailis, "Influence of Stored Energy at Step Discontinuities of the Behavior or Surface-Wave Gratings", *IEEE Trans. on Sonics and Ultrasonics*, SU-22, p. 189 (1975), the reflection that is referred to an edge can have both a real component due to an impedance discontinuity and an imaginary component due to stored energy term. As stated earlier, a center of reflection is defined herein as the point where the phase of reflection is pure imaginary. With this definition, both stored energy contributions and impedance discontinuity contributions will result in a pure imaginary reflection coefficient at the center of an electrode or at the center of a gap. Thus, this model is consistent for surface wave substrates having a plane of reflection symmetry perpendicular to the wave propagation direction.

B. H. Auld, in *Acoustic Fields and Waves in Solids*, Vol. II, John Wiley & Sons, Inc., 1973, gives expressions which can be used to calculate SAW transduction on crystals with arbitrary symmetry on pages 170-171 therein. A separate section of the same book, pp. 305-309, considers the reflection of surface acoustic waves from a single isolated electrode on a substrate with arbitrary symmetry. However, all previous models for transducers with internal reflection have been specialized for cases of substrates with a plane of reflection symmetry perpendicular to the propagation direction. Thus, the possibility of arbitrary spacing of the centers of transduction with respect to the centers of reflection has not been previously recognized or considered.

Thus, all known existing SAW transducers are analyzed and explained on the basis of the centers of transduction being located either at the centers of the fingers or at the centers of the gaps and the centers of reflection being pure imaginary and located at the centers of the electrodes. These choices of placement of centers of reflection and transduction are consistent for crystals with reflection symmetry perpendicular to the direction of wave propagation. Consequently, the simplest form of transducer with two electrodes-per-wave-length will have strong internal reflections but since the centers of transduction and the centers of reflection are coincident, or displaced by $\lambda/4$, the reflected waves are always in quadrature with respect to the transduced waves for both forward and backward wave radiation from the transducer. Thus, bi-directional response is an inherent feature of transducers with the location of reflection centers and transduction centers as set forth above. A single-phase unidirectional transducer could not be achieved therefore in the prior art utilizing the simplest form of SAW transducer as described above.

More recently, some of these disadvantages have been overcome by utilizing single-phase unidirectional transducers such as those described in U.S. Pat. No. 4,353,046 which are more complex than the simplest form of SAW transducer. In this structure, the acoustic reflections are used to cancel the regenerated reflections and unidirectional behavior results. These transducers are simple to fabricate and tune, however, thereby overcoming many disadvantages of the multiphase devices. However, the finger and gap widths in a single-phase unidirectional transducer (SPUDT) are of split finger construction and are one-eighth of the operating acoustic wave length thus limiting the frequency range of the device by photolithographic constraints to a maximum frequency of operation of around 600 MHz when compared to the simplest form of SAW transducer described earlier. Further, only low reflection coefficients have been obtained to date from the $\frac{1}{8}\lambda$ finger or electrodes which generally restricts the achievable bandwidth of the device.

As further explained in U.S. Pat. No. 4,353,046 the reason the split finger SAW device becomes unidirectional is that alternate fingers of the split finger electrodes are loaded with extra material. The centers of acoustic wave reflection of the SAW device are considered in the prior art to be the centers of the loaded electrodes whereas the centers of transduction remain either at the center of a split electrode pair or at the centers of the gaps between fingers of opposite polarity. Thus, the centers of reflection are separated in phase from the centers of transduction by one-eighth wave length of the given frequency. This separation of the centers of transduction and reflection causes the surface waves generated by a transducer in one direction due to its electrical transduction to be cancelled by the acoustic wave reflections from the weighted electrodes. In the opposite direction such reflections reinforce. Thus, the device is unidirectional because the loading of the transducer electrodes shifts the centers of reflection to locations one-eighth of a wave length from the corresponding centers of transduction. This prior art single phase unidirectional transducer device assumes that a plane of reflection symmetry exists perpendicular to the direction of propagation. This assumption for operation of that device was not well understood previously.

The above description refers to use of the single-phase unidirectional transducer in a transduction mode. When this same structure is used to receive a surface acoustic wave, the acoustic reflections of the structure are now properly phased to cancel the reflections due to regeneration. The result is that very low reflectivity occurs at the acoustic port and good triple transit suppression occurs in this device under conditions of a good electrical match at the electrical port.

A single-phase unidirectional transducer achieves its unidirectional behavior by the one-eighth wave length phase separation within the transducer between the centers of transduction and reflection. A conventional single-phase unidirectional transducer achieves this phase separation by a localized asymmetry (asymmetry within at least one transducer period, typically one wave length) of the transducer structure (weighted electrodes) shifting the center of reflection with respect to the center of transduction thereby giving rise to the asymmetric response of the device. See Hartmann, C. S. et al, "An Analysis of SAW Interdigital Transducers With Internal Reflections and the Application to the Design of Single Phase Unidirectional Transducers," *IEEE Ultrasonics Symposium Proceedings*, 1982, pp. 40-45.

There is another asymmetry which may be exploited, as in the present invention, to achieve a unidirectional response from a structure having localized symmetry by shifting the centers of transduction with respect to the centers of reflection (instead of shifting the centers of reflection with respect to the centers of transduction as done in the prior art) by appropriate choice of substrate cut and orientation of the electrodes thereon.

The preferred embodiment of the present invention in its simplest form overcomes the disadvantages of the prior art by providing a surface acoustic wave transducer structure of the simplest form which has one-quarter wave length unweighted electrode fingers and gaps thereby enabling use of the largest size electrode fingers and gaps that can be constructed and yet providing transduction and reflection centers spaced in phase with respect to each other so as to give wave cancellation in one direction and wave reinforcement in the other thereby forming a single-phase unidirectional transducer for any given frequency. This could not be done in the prior art with this same simple transducer structure because the internal mechanical reflections were always in quadrature with the generated acoustic waves in both directions thereby preventing wave cancellation in either direction.

The present invention allows a simple two electrode per wave length transducer to be unidirectional by selectively orienting the transducer means on a given substrate having at least a layer of piezoelectric crystal so as to cause acoustic wave propagation in the piezoelectric layer in an orientation such that for a given electrical load, the transduction centers are shifted with respect to the reflection centers so as to cause them to be separated by the desired phase separation thereby enabling mechanical wave reinforcement in one wave propagation direction and mechanical wave cancellation in the other wave propagation direction to obtain a single-phase unidirectional transducer.

Previous SAW devices were constructed on crystal directions with high symmetry. As stated earlier, on such crystal orientations in the prior art, the centers of reflection are always considered to be located under the electrodes and the reflection coefficients are pure imaginary. Similarly, on such directions the centers of transduction are either located in the centers of the gaps or under the centers of the electrodes. However, other crystal orientations exist which do not have the symmetry properties but have useful surface acoustic wave device properties. In these other orientations the centers of transduction will generally be located at an arbitrary location depending on the anisotropy of the crystal. The centers of reflection will potentially move to another location but will generally be dominated by an acoustic variable and hence will remain located under the electrodes. The uncertainty in the acoustic reflection phase exists because the acoustic reflection is caused by reflections due to several components of wave motion including both acoustic and electrical variables. Generally, one can make reasonably accurate theoretical predictions of the location of the centers of transduction by looking at the phase angle of the electric potential with reference to the phase of the longitudinal component of the acoustic wave motion. Crystal orientations are identified where the electric potential is either at $\pm 45°$ or $\pm 135°$ with respect to this longitudinal wave component and such directions are generally considered to be very near optimum directions for devices under this present invention. In practice, devices are built experimentally in the vicinity of these directions to identify the exact orientation where optimum single phase unidirectional behavior occurs. It should also be noted that very useful single-phase unidirectional transducer behavior can be achieved for orientations where the separation between reflection and transduction centers depart from the one-eighth wave length which is nominally desired.

The present invention therefore utilizes the electric surface potential of a SAW device which, because piezoelectric crystals are anisotropic, may vary in phase from $-180°$ to $+180°$ depending upon the wave propagation orientation in the crystal substrate thereby enabling shifting of the centers of transduction (with respect to the centers of reflection) through the continuum of phase angles of achievable range of $0°-360°$ thus allowing the distance between the centers of reflection and the centers of transduction to be set at any desired separation between $-\frac{1}{2}$ wavelength to $+\frac{1}{2}$ wavelength. The present invention utilizes this phenomenon in particular positions of interest such as $\pm 45°$ ($\frac{1}{8}\lambda$ or $-\frac{1}{8}\lambda$ where $\lambda$ is one wave length at the frequency of interest) or $\pm 135°$ ($\frac{3}{8}\lambda$ or $-\frac{3}{8}\lambda$). In these positions, the centers of transduction in a simple transducer with $\frac{1}{4}\lambda$ electrodes are located approximately at the electrode edges or one-eighth wave length from the centers of reflection which are located approximately at the centers of the electrodes. This creates a unidirectional transducer using a simple SAW device having localized symmetry with one-quarter wave length electrodes and gaps.

Also, the invention allows the construction of a SAW device with an adjustable phase separation between the centers of reflection and the corresponding centers of transduction by shifting the centers of transduction thereby enabling a desired mismatch to occur between the SAW device and an electrical load in particular situations where it may be advantageous to obtain low acoustic reflection on the desired acoustic port without changing the electrical load or transducer construction.

In the present invention, the electrical regenerated wave reflections as determined by the external load are cancelled by the mechanical reflections in one direction in a simple two electrodes per wave length transducer or a transducer having localized symmetry. Since the electrical regeneration reflections are a function of the load, reflections on the desired acoustic port are minimized under specific loading conditions by creating centers of transduction separated from the centers of reflection by a desired phase separation by selectively positioning the transducer on a desired piezoelectric crystal cut to cause acoustic wave propagation in the crystal at desired Euler angles.

It has also been discovered that by shifting the centers of transduction to a specific location, the same shift of $\frac{1}{8}\lambda$ required for unidirectional behavior, the wave shape or form of the input conductance of the SAW device varies to allow a symmetrical input conductance to be obtained. See Hartmann, C. S. et al, pages 42–43, cited above. This conductance wave shape, prior to the present invention, could not be achieved with the simplest form of surface acoustic wave transducer and, as the prior art discloses, the input conductance of such device was asymmetrical. Thus, the symmetry of the input conductance of the simplest form of surface acoustic wave transducer of the present invention cannot be explained by existing prior art models. Yet the symmetrical shape of the input conductance of the SAW transducer of the present invention is extremely important in the construction of circuits such as notch filters where larger notch band width and greater sensitivity are important.

Thus, it is an object of the present invention to position a surface acoustic wave transducer having localized symmetry on a given substrate so as to cause acoustic wave propagation in the substrate in an orientation so as to shift the centers of transduction with respect to the centers of reflection such that for any given frequency and electrical load the phase response of the transducer is unidirectional.

It is an object of the present invention to selectively orient an acoustic surface wave transducer having localized symmetry and one-quarter wave length electrodes and gaps for any given frequency on a given substrate having at least one layer or piezoelectric material so as to shift the centers of transduction with respect to the centers of reflection sufficiently to cause unidirectional acoustic wave propagation in the piezoelectric layer for any given electrical load.

It is still another object of the present invention to construct a SAW device with a substrate having at least one piezoelectric layer and a transducer constructed with localized symmetry for establishing predetermined centers of wave reflection on the substrate and selectively positionable on the substrate for causing wave propagation in a predetermined orientation in said substrate thereby enabling centers of transduction to be located in any predetermined phase relationship with respect to the centers of reflection throughout 0°–360° of an achievable range of phase separation.

SUMMARY OF THE INVENTION

Thus, the present invention relates to a single-phase unidirectional transducer SAW device having transduction and reflection centers associated therewith and comprising a substrate having at least one layer of piezoelectric material thereon and an acoustic surface wave transducer constructed with localized symmetry for establishing predetermined centers of acoustic wave reflection on the layer of piezoelectric material and selectively positionable on the substrate for establishing centers of transduction at any predetermined wave phase separation from said centers of reflection in the achievable range continuum of phase angles from 0°–360°.

It is also an object of the present invention to disclose a method of forming a single-phase unidirectional surface acoustic wave transducer device having transduction and reflection centers associated therewith comprising the steps of providing a substrate having at least one layer of piezoelectric material thereon and placing an acoustic surface wave transducer having one-quarter wave length electrodes and gaps for any given frequency on the layer of piezoelectric material for causing acoustic wave propagation in said substrate in a selected orientation so as to cause unidirectional acoustic wave propagation in the surface layer.

BRIEF DESCRIPTION OF THE DRAWINGS

These and other objects of the present invention will be disclosed in conjunction with the attached drawings in which:

FIG. 1 is a schematic illustration of the basic components of a SAW filter;

FIG. 2 is a block diagram illustrating the acoustic and electrical ports of a bidirectional SAW filter;

FIG. 3 is a schematic drawing of a three phase unidirectional SAW filter;

FIG. 4a is a diagrammatic representation of the building blocks of a conventional single-phase unidirectional transducer;

FIG. 4b is a cross-section of the conventional single-phase unidirectional transducer;

FIG. 5 is a diagrammatic representation of a conventional single-phase unidirectional transducer with asymmetrical construction;

DETAILED DESCRIPTION OF THE DRAWINGS

Figure 6:
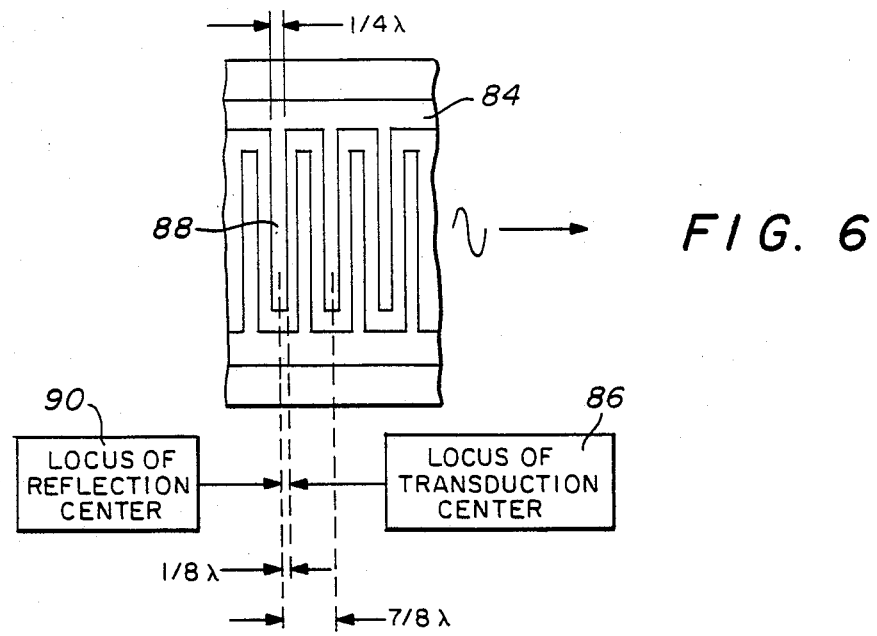
FIG. 6 is a diagrammatic representation of a basic transducer of a surface acoustic wave device from which the transduction and reflection centers can be illustrated in a natural single-phase unidirectional transducer of the present invention.

The fundamental building block of a surface acoustic wave device used for a filter is illustrated generally by the numeral 10 in FIG. 1. In its simplest form, a surface acoustic wave (SAW) transducer having localized symmetry consists of a periodic interdigitated electrode pattern 12 and 14 positioned on the surface of a piezoelectric crystal substrate 16. When a RF signal is applied by generator 18 to input arms 20, 22, the electric field between the interdigital electrodes 24 and 26 results in the generation of surface acoustic waves (represented by wave form 27) on the surface of the piezoelectric crystal structure 16. Each pair of electrodes 24 and 26 effectively acts as a source of waves at a point called the center of transduction (as defined earlier). The strongest waves are generated at the "synchronous frequency" where the wave length of the generated waves equals the periodicity of the interdigital grating. The width of electrodes 24 and 26 and the gap 28 in such a transducer 10 are each, thus, one-quarter of the operating acoustic wave length. This interdigital transducer structure 10 can also convert incident acoustic waves into an electrical output signal at output transducer 14 with a similar peaking of conversion efficiency at the synchronous frequency. The frequency selectivity inherent in the transduction process is the basis for most of the unique filtering functions which surface acoustic wave devices can perform.

Reflections of the acoustic wave occur when they strike the electrodes 24 and 26 at points called centers of reflection. These centers of reflection are established by the construction of the transducer electrodes and the characteristics of the surface wave on the substrate being used as will be described in more detail hereinafter. Further, regeneration reflections, inherent in this structure, are affected by electrical loads $R_S$ and $R_L$ attached to the input and output transducers respectively.

The surface acoustic wave transducer 10 may be represented as the lossless three-port network 40 or 42 shown in FIG. 2 with two acoustic ports and at least one electric port. A complete surface acoustic wave filter is formed by interconnecting two transducers 40 and 42 by means of their acoustic ports 30 and 31 as illustrated in FIG. 2. The deleterious echo effects in the SAW device occur when mismatch is present at the interconnected acoustic ports resulting in signals bouncing back and forth inside the device and emerging with greater time delays.

The most common approach for solving this problem is to electrically mismatch the transducer towards a short circuit that results in a 20 to 25 dB filter loss before acceptable echo suppression is achieved.

A more sophisticated alternative approach to solving this problem to date has been the utilization of an interdigital structure with three or four sets of electrodes per wave length. FIG. 3 shows a 3-electrode-per wavelength structure. When driven by properly phased voltages at terminals 44, 46 and 48, the surface wave is launched substantially from only one end of the transducer. Under these conditions, triple transit reflections are eliminated.

However, this structure requires, in practical devices, multi-level metal structures with air gap crossovers 58 on the crystal surface 60. These are difficult and expensive to fabricate and require complex three phase matching networks at both terminals 50 and 52 for proper operation. Further, the finger 54 width and gap width 56 in a three electrode per wave length structure are only one-sixth of the operating acoustic wave length. At extremely high frequencies, this becomes a limiting factor in the fabrication of the device.

The present invention can be used to create a low loss unidirectional transducer from a single two-electrode-per-wave-length transducer which is a "natural" single-phase device that corresponds to the well known existing single-phase unidirectional transducer structures of more complex structures which are known as "conventional" SPUDTS as described earlier in relation to U.S. Pat. No. 4,353,046. While the basic principles of the operation of the novel natural single-phase unidirectional transducer disclosed herein are identical to the conventional SPUDT, the structure is fundamentally different.

The conventional single-phase unidirectional transducer is constructed as disclosed in FIGS. 4a and 4b. As can be seen in FIG. 4a, the conventional single-phase unidirectional transducer structure comprises a split-finger electrode transducer 62 mounted on a piezoelectric base 63 with a reflective grating 64 superimposed thereon. The reflective grating is achieved by using an overlay such as thicker metal on every other electrode 68 shown mounted on base 66. A conventional split-finger transducer is commonly considered to have no discontinuity reflections as is well known in the art because the reflected waves from one electrode and its nearest neighbor are 180° out of phase and cancel. The reflections are thus entirely due to the centers of reflection established by the additional metal on alternate electrodes 68. As will be noted in FIG. 4b there is an offset of one-eighth of a wave length between the center of each reflector element (the center of reflection) and the center of each overlapping split electrode pair (the center of transduction). The latter offset is crucial to the operation of a conventional single-phase unidirectional transducer because that condition causes the directly generated waves and the reflected waves to cancel in one direction and to enhance one another in the opposite direction.

The unidirectional nature of a single-phase unidirectional transducer differs significantly from that of the multiphase unidirectional transducer. In the latter, each small subsection of the transducer is unidirectional. In a single-phase unidirectional transducer each small subsection is only weakly unidirectional with the total unidirectional properties emerging only when the complete transducer array is considered.

The conventional understanding of the operation of a single-phase unidirectional transducer can be realized from a microscopic point of view by reference to FIG. 5. In FIG. 5 comb-like structures 70 and 72 have split finger pairs 74 and 76 interleaved in an interdigitated manner with like pairs attached to one arm of the comb-like structure. The conventional understanding of the centers of transduction, for common crystal cuts and wave propagation orientations of 0°, 90°, 180° and 270° with respect to the piezoelectric substrate, is that it lies either at the center 78 of a split finger pair 82 or in the gap between electrodes of opposite polarity as indicated at 79. The center of reflection for each split finger pair is understood to be displaced or shifted, as mentioned earlier, by one-eighth wave length since the reflection is due to the additional mass loading of alternate electrodes and is thus located at the center of the loaded electrodes as designated by the numeral 80.

For simplicity, consider a single center of transduction 78 and two centers of reflection 79 and 80, one on each side as shown in FIG. 5. Consider the acoustic wave propagating to the right in FIG. 5 to be the desired forward direction acoustic wave and that wave propagating to the left to be the undesired reverse direction acoustic wave. The three-eighths wave length displacement between transduction center 78 in split finger pair 82 and reflection center 80 in the mass loaded electrode of split finger pair 74 results in the reflections of the reverse acoustic wave being in phase with the directly transduced forward acoustic wave. In contrast, the reflections of the forward acoustic wave from reflection center 79 is out of phase with the directly transduced reverse acoustic wave. Thus, the transduction in the reverse direction is attenuated as a result of destructive interference whereas that in the forward direction is enhanced as a result of constructive interference.

The "conventional" SPUDT achieves its unidirectional behavior by the physical displacement and loading of the electrodes within the transducer to shift the centers of reflection which creates the proper wave length difference of $\frac{1}{8}\lambda$ between the centers of transduction and reflection. Thus, it is the loading of the alternate electrodes which shifts the centers of reflection to point 80. Therefore, it is the asymmetry of the structure caused by the loading of alternate electrodes that gives rise to the asymmetric or unidirectional response of the device. The present invention, however, provides another asymmetry that is used to achieve a unidirectional response from a symmetric structure.

FIG. 6 illustrates a simple two electrode transducer construction having localized symmetry wherein two electrodes and two spaces represent one wave length and thus the electrodes and the gaps represent one-quarter wave length each. A surface acoustic wave propagating on the piezoelectric substrate 84 has an associated electric surface potential. As used herein, the term "substrate" implies a given crystal material cut at a specific orientation with respect to the crystal axes as will be explained hereafter with respect to FIG. 7. It is via this associated potential that transduction occurs between the voltage across the transducer elements to generated acoustic waves. Piezoelectric crystals are, by their very nature, anisotropic. Thus, the phase of the electric potential of a surface acoustic wave device referenced to a mechanical or acoustical displacement of the wave varies with the wave propagation orientation in the crystal. For most common crystal cuts and orientations used which have a high degree of symmetry, the phase of the electric potential, with respect to the acoustic wave, is approximately 0°, 90°, 180° or 270°. This results in the centers of transduction, in a simple two-electrode-per-wave-length transducer as shown in FIG. 6, being at the centers of the electrode fingers or gaps. In this case, the centers of reflection and transduction are separated by an integer multiple of ¼λ. Thus, internal reflections are deleterious to the operation of the SAW device.

More generally, it is well known in the art that the SAW electric potential phase may vary from −180° to +180°, for many crystals, depending upon the wave propagation direction. Since the positions of the centers of transduction are related to the electric potential phase and since the electric wave can vary in potential from −180° to +180° depending upon the orientation of wave propagation in the crystal, the centers of transduction may thus be varied through a continuum having possible ranges of 0°–360° while the locations of the centers of reflection remain substantially constant or fixed assuming that these reflections are dominated by the mechanical discontinuities. This remarkable and novel feature can be achieved simply by selectively placing the transducer electrodes on the substrate in such an orientation as to cause the wave propagation orientation through the substrate to vary through the continuum having a possible range of 0°–360° depending upon the piezoelectric material, the cut and the wave propagation orientation through the piezoelectric material.

Figure 7:
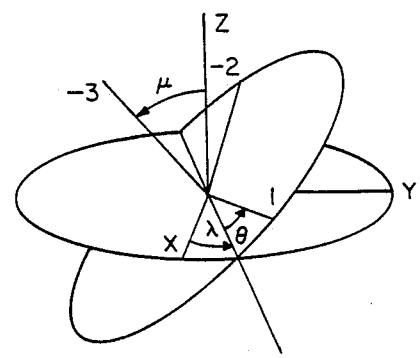
FIG. 7 shows the Euler angles which are used to define the axes and wave propagation directions for crystals.

The orientations for surface acoustic wave propagation for any given crystal are completely defined by the Euler angles, lambda, mu and theta as shown in FIG. 7. The first two angles, lambda and mu, define the crystal cut and the third angle, theta, defines the direction of acoustic wave propagation in that cut. Thus, acoustic wave propagation orientation in the crystal is defined by a unique set of all three Euler angles. (See Goldstein, H., *Classical Mechanics*, New York, (1950) Addison-Wesley) A theoretical tabulation of surface acoustic wave propagation properties at various orientations for a variety of surface wave materials and particular crystal cuts of interest can be generated and tabulated. A tabulation including velocity, coupling coefficient, electromechanical power flow angle curves, and magnitude and phase of the free surface mechanical displacements can be found in *Microwave Acoustic Handbook* IA and 2, Slobodnik et al, Air Force Cambridge Research Labs, October 1973 and October 1974. Such data as set forth in these handbooks, can be used as a guide to selecting appropriate directions for wave propagation and orientation in the crystal necessary to achieve the desired transduction characteristic. In addition to those listed, principal properties of interest include effective centers of transduction, centers of reflection, temperature coefficient of delay, spurious bulk responses, diffraction characteristics, effective dielectric constants and the like. Obviously, any type of crystalline material can be analyzed in like manner and a tabulation of the wave propagation orientations generated for that material.

Thus, to achieve "natural" single phase unidirectional behavior for any given input signal and electrical load, a one-eighth wave length difference in location between the loci of the transduction centers and the loci of the reflection centers can be obtained simply by selectively orienting a two electrode transducer (¼λ electrodes) on a specific crystal cut. For example, if the centers of reflection are located at the centers of the electrodes, the centers of transduction 86 can be positioned as shown in FIG. 6 at the edges of electrodes 88 (λ/8) by choice of substrate cut and electrode orientation thereby achieving the desired separation of ⅛ wave length between the centers of transduction and reflection.

Thus, for any given substrate, electrode construction, load and input signal, the centers of transduction may be shifted to vary the phase angle between the centers of reflection and centers of transduction, by selective placement or orientation of the electrodes on the substrate, to obtain a natural single-phase unidirectional transducer or to obtain a transducer with any other desired radiation characteristics.

A unidirectional SAW device of the present invention may be constructed by selecting a specific cut of a piezoelectric crystal as determined by the Euler angles, lambda and mu, forming a transducer with localized symmetry (symmetry within at least one transducer period, typically one wave length) and causing the transducer to be unidirectional by selectively positioning the transducer on the crystal cut in a specific direction determined by the Euler angle, theta. By selectively positioning or orienting the transducer on the crystal cut, acoustic wave propagation through the crystal in a predetermined orientation will occur which will establish centers of transduction separated from centers of reflection by ±45° phase separation or ±135° phase separation thereby creating a unidirectional transmission of the acoustic waves by the transducer. The desired locations of the centers of transduction with respect to the centers of reflection for a particular electrical load can be calculated and the specific crystal cut having the required properties can be selected to form the substrate on which the transducer can be selectively positioned to obtain those desired locations.

From the transducer shown in FIG. 6 it will be understood that, in general, each of the electrodes 88 in a two-finger-per-wave-length transducer may give rise to acoustic reflection. Assume, for example, that the centers of reflection are the centers of the one-quarter wave length wide electrodes 88. The response of the transducer will be asymmetric despite the fact that the electrode pattern is totally symmetric. The big advantage of the present unique natural single-phase unidirectional transducer compared with a conventional single-phase unidirectional transducer is that the electrode fingers are twice as wide which enables devices to be built at twice the frequency. Further, larger reflection coefficients can be achieved with λ/4 electrodes which result in lower insertion loss and/or wider bandwidth.

Figure 8:
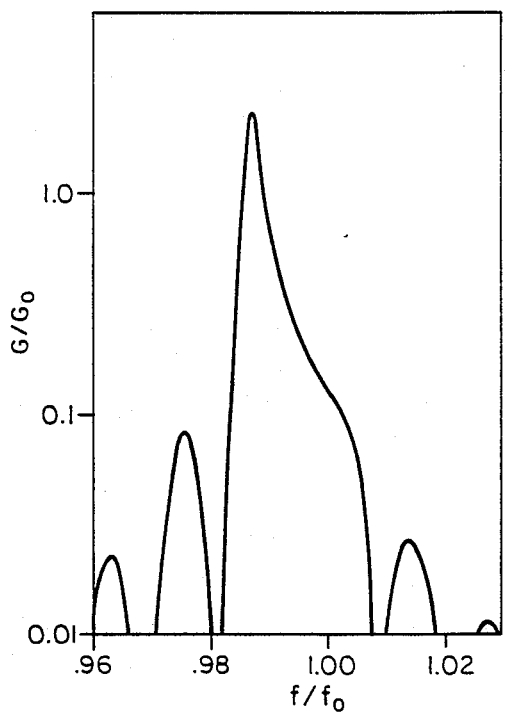
FIG. 8 is a graph of theoretical conductance versus frequency for a conventional simple two-electrode-per-wave-length transducer with internal electrode reflections.

Another important advantage of the present invention is that it may be used to obtain a greater range of variations of the input conductance of the transducer. For prior art transducers, the graph of input conductance versus frequency for a transducer having significant internal electrode reflections is as shown in FIG. 8. This graph is for a simple two-electrode-per-wavelength transducer having local symmetry and oriented on a crystal cut with reflection symmetry. The input conductance, as can be seen, is asymmetric. A reverse in the asymmetry of the conductance may be obtained depending upon the sign of the electrode reflection coefficients or the location of the transduction centers (i.e. under the electrodes or in the gaps).

Figure 9:
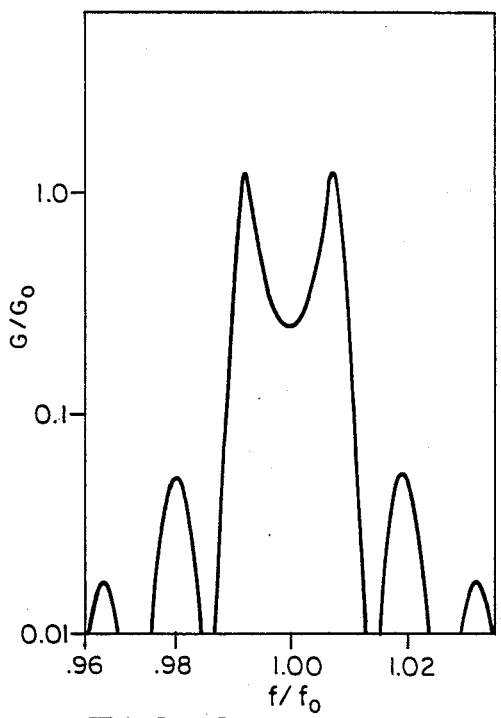
FIG. 9 is a graph of theoretical conductance versus frequency for the simple two-electrode-per-wave-length transducer of applicant's present invention.

FIG. 9 is a graph of a plot of input conductance versus frequency of a theoretical model of a natural single-phase unidirectional transducer showing that the conductance is totally symmetric about the center frequency.

Figure 10:
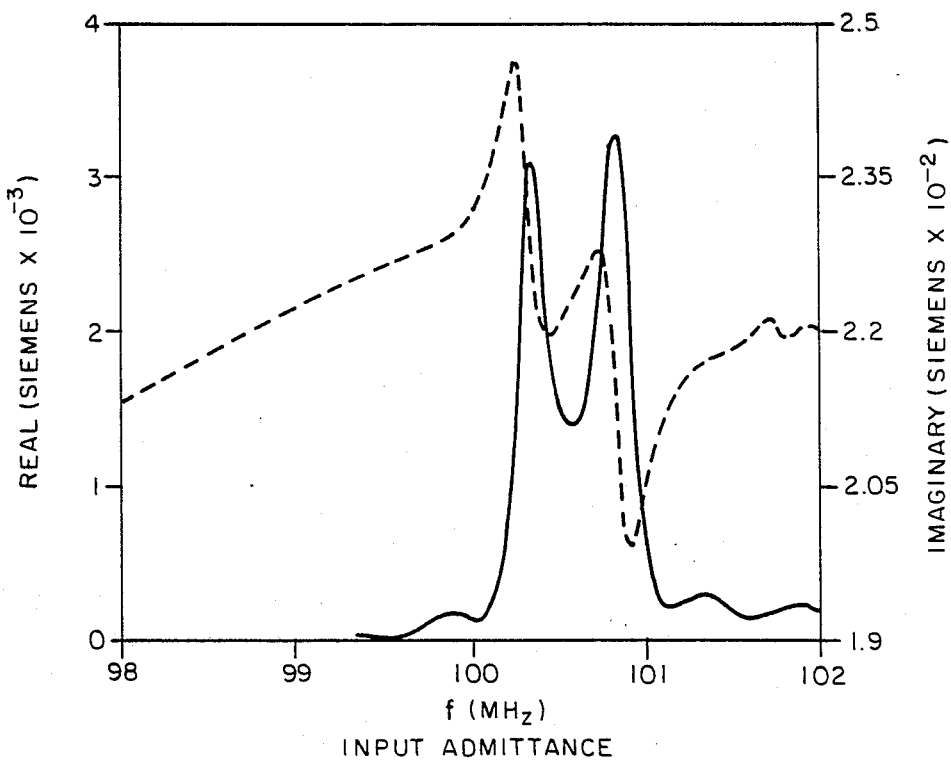
FIG. 10 is a graph of conductance versus frequency obtained from an actual test of applicant's novel invention.

In an actual test of applicant's novel invention, using a transducer with the same simple two-electrode-per-wave-length construction, by selectively orienting the electrode structure on the substrate so as to cause acoustic wave propagation through the crystal at an orientation so as to shift the centers of transduction to the electrode edges or $\frac{1}{8}\lambda$ removed from the centers of reflection, the graph of conductance versus frequency as shown in FIG. 10 was obtained. The conductance, it will be noted, is symmetrical and agrees with the graph of FIG. 9 obtained by the theoretical model. By varying the wave propagation orientation direction in the crystal, a variable input conductance may be achieved which includes the dependencies shown in FIG. 8 and FIG. 9. This control over the variation in the dependence of the input conductance with frequency can be used to advantage in many circuits. The X and Y axis ranges shown in FIG. 10 are, of course, representative and not limiting.

A simple SAW filter would require two single-phase unidirectional transducers which are unidirectional in opposite directions. With the conventional structure this simply requires reversing the asymmetry in the two transducers. With a natural single-phase unidirectional transducer, the direction of unidirectionality can only be reversed by changing the signs of the electrode reflection coefficients. This may be achieved, for example, by using different metals in the two transducers. The magnitude of the electrode reflections can be adjusted by varying the metal thickness of the electrodes.

Figure 11:
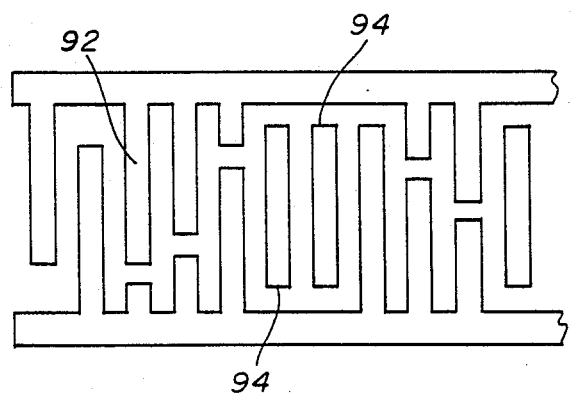
FIG. 11 is a schematic representation of an alternate transducer having localized symmetry but which is more complicated than a simple two-electrode-per-wave-length transducer and which can be used with the present invention.

It will be understood that the application of the present discovery and invention is not limited to simple two-electrode-per-wave-length transducers but may also be used with other configurations such as, for example only and not by limitation, that shown in FIG. 11. Note in FIG. 11 that while localized symmetry exists, the electrodes may be isolated as at 94, withdrawal weighted as at 92 and non-symmetrical as evidenced by the construction of the entire transducer shown in FIG. 11.

Thus, the novel device can be used with multiple transducers each having electrodes with different metalizations or multi-layer metal combinations, electrodes having dielectrics on metals, structures having uniform metalization with grooves either between or under electrodes and various other metal combinations. Further, the novel surface acoustic wave device can be used effectively with convolvers, resonators, filters of all types such as bandpass, low-pass, high-pass and notch filters, and like circuits, as examples and not limitations.

Thus, there has been disclosed a novel transducer forming a SAW device in which the centers of transduction can be shifted over a possible range of ±180° to create any desired separation from the centers of reflection for any given transducer construction, electrical load and frequency. In the case of a natural single-phase unidirectional transducer where the transducer is a simple two electrode type with $\frac{1}{4}\lambda$ width electrodes and gaps, the transducer is positioned on the substrate so as to shift the centers of transduction from the centers of reflection by a $\frac{1}{8}\lambda$ separation thereby obtaining unidirectional wave propagation from a symmetrical transducer.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

I claim:

1. A method of forming a surface acoustic wave device comprising the steps of:
   a. forming a substrate having at least a piezoelectric layer,
   b. constructing a transducer for establishing predetermined centers of reflection and transduction on said substrate, and
   c. controlling the location of said centers of transduction to obtain any predetermined wave phase separation from said centers of reflection in a continuum of phase angles in the range of 0°–360° by selectively positioning said transducer on said substrate.

2. A method as in claim 1 wherein said step of establishing said reflection centers comprises:
   a. forming at least first and second opposing electrical pads, and
   b. attaching at least one electrode to each of said first and second pads in interdigital relationship to define a transducer structure.

3. A method as in claim 2 wherein the step of obtaining said desired wave phase separation further comprises the steps of:
   a. determining the location of desired centers of transduction in phase relation to said centers of reflection, and
   b. creating centers of transduction in desired locations to obtain said desired wave phase separation by selectively positioning said transducer on said substrate to cause acoustic wave propagation in said substrate in a desired orientation.

4. A method as in claim 3 wherein said step of creating said centers of transduction includes attachment of said transducer to said substrate with respect to desired Euler angles thereby enabling said centers of transduction to be located in a predetermined phase relationship with respect to said centers of reflection throughout a predetermined achievable range of 0°–360° phase separation.

5. A method as in claim 4 further including the step of constructing said transducer in a symmetrical form with only one-quarter wave length electrodes whereby unidirectional transmission of acoustic waves from said transducer occurs when the wave separation of said centers of reflection and transduction is at ±45° or ±135°.

6. A method of forming a surface acoustic wave device comprising the steps of:
   a. constructing a transducer having two electrodes per wave length for positioning on a desired piezoelectric crystal cut with predetermined Euler angles, and
   b. causing unidirectional acoustic wave propagation in said crystal by selectively orienting said transducer on said crystal cut.

7. A method as in claim 6 wherein said step of constructing said transducer comprises the steps of:
   a. forming at least first and second opposing electrical pads, and
   b. extending at least one electrode from each of said first and second pads in interdigitated relationship to define said transducer structure.

8. A method as in claim 7 further including the steps of:
   a. forming predetermined centers of wave reflection in said crystal based upon said transducer electrode structure,
   b. determining the location of desired centers of transduction in said crystal in relation to said centers of reflection, and
   c. creating said centers of transduction in said desired locations by selectively orienting said transducer on said crystal cut.

9. A method as in claim 8 further comprising the step of selectively orienting said transducer on said crystal cut at predetermined Euler angles thereby enabling said centers of transduction to be varied with respect to said centers of reflection throughout the achievable range of 0°–360° phase separation.

10. A method of forming a surface acoustic wave device comprising the steps of:
    a. selecting a piezoelectric crystal,
    b. selecting a particular cut of said crystal,
    c. forming at least one transducer having at least two electrodes per wavelength thereon for creating centers of wave reflection and transduction in said substrate,
    d. attaching an electrical load to said transducer, and
    e. shifting the phase locations of said centers of transduction to predetermined phase locations with respect to said centers of reflection by selectively positioning said transducer on crystal cut to cause wave propagation in said crystal in a predetermined orientation.

11. A method of forming a surface acoustic wave device as in claim 10 wherein the step of shifting the phase locations of said centers of transduction further comprises the step of shifting said phase locations of said centers of transduction with respect to said centers of reflection through an achievable phase angle continuum within the range of 0°–360°.

12. In a method for constructing a surface acoustic wave device having a piezoelectric substrate, at least one transducer electrode pair on said substrate, an electrical load attached to said transducer electrode pair, an electrical input coupled to said electrode pair for generating surface acoustic waves in said substrate and having centers of wave reflection on said substrate, the improvement comprising the steps of:
    a. selecting a specific cut of a piezoelectrical crystal,
    b. forming said transducer with said at least one pair of electrodes separated approximately by ½ wavelength, and
    c. causing said transducer to be unidirectional by selectively positioning said transducer on said crystal cut in a specific direction.

13. A method as in claim 12 wherein the step of causing said transducer to be unidirectional further comprises the step of causing wave propagation in a predetermined orientation in said crystal for establishing centers of transduction separated from said centers of reflection by ±45° phase separation or ±135° phase separation thereby creating a unidirectional transmission of said acoustic waves by said transducer.

14. An improved method of forming a SAW device having a piezoelectric crystal substrate, at least one transducer having at least one pair of electrodes with localized symmetry and being mounted on said substrate such that centers of wave reflection are established with respect to said electrodes, and an electrical load attached to said transducer, the improvement comprising the steps of:
    a. selecting predetermined desired phase locations for centers of transduction with respect to said centers of reflection,
    b. selecting a specific cut of said piezoelectrical crystal, and
    c. causing said centers of transduction to be positioned at said desired phase locations with respect to said centers of reflection by selectively positioning said transducer on said crystal cut such that wave propagation through said substrate is in a predetermined orientation.

* * * * *